(12) United States Patent
Burke et al.

(10) Patent No.: US 7,385,273 B2
(45) Date of Patent: Jun. 10, 2008

(54) POWER SEMICONDUCTOR DEVICE

(75) Inventors: Hugo R Burke, Pontyclun (GB); Simon Green, Cardiff (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/449,940

(22) Filed: Jun. 9, 2006

(65) Prior Publication Data

US 2006/0286732 A1    Dec. 21, 2006

Related U.S. Application Data

(60) Provisional application No. 60/689,293, filed on Jun. 10, 2005.

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ............... 257/488; 257/288; 257/287; 257/341; 257/342; 257/401; 257/489; 257/E21.418; 257/490; 257/491; 257/494; 257/495; 257/207; 257/578; 257/E29.257; 257/E21.38

(58) Field of Classification Search ........... 257/287, 257/288, 341, 401, 342, 488, 489, 490, 491, 257/494, 495, 207, 578, E29.257, E21.38, 257/E21.418

See application file for complete search history.

(56) References Cited

U.S. PATENT DOCUMENTS

| | | | | |
|---|---|---|---|---|
| 4,290,078 A | * | 9/1981 | Ronen | 257/409 |
| 4,399,449 A | * | 8/1983 | Herman et al. | 257/490 |
| 4,680,853 A | * | 7/1987 | Lidow et al. | 438/268 |
| 4,789,882 A | * | 12/1988 | Lidow | 257/328 |
| 5,474,946 A | * | 12/1995 | Ajit et al. | 438/138 |
| 5,644,148 A | * | 7/1997 | Kinzer | 257/133 |
| 5,869,371 A | * | 2/1999 | Blanchard | 438/268 |
| 6,104,060 A | * | 8/2000 | Hshieh et al. | 257/329 |
| 6,563,197 B1 | * | 5/2003 | Wagers et al. | 257/630 |
| 6,784,489 B1 | * | 8/2004 | Menegoli | 257/343 |
| 6,893,923 B2 | | 5/2005 | Spring et al. | |
| 2002/0072196 A1 | * | 6/2002 | Ajmera et al. | 438/424 |

* cited by examiner

*Primary Examiner*—Steven Loke
*Assistant Examiner*—Tram H Nguyen
(74) *Attorney, Agent, or Firm*—Ostrolenk, Faber, Gerb & Soffen, LLP

(57) ABSTRACT

A power semiconductor device that includes a plurality of gate structure each having a gate insulation of a first thickness, and a termination region, the termination including a field insulation body surrounding the active region and having a recess that includes a bottom insulation thicker than the first thickness.

9 Claims, 3 Drawing Sheets

POWER SEMICONDUCTOR DEVICE

RELATED APPLICATION

This application is based on and claims benefit of U.S. Provisional Application Ser. No. 60/689,293, filed on Jun. 10, 2005, entitled Self Aligned Contact Improvement to Form Self Aligned Gate Contact and Save One Mask Step, to which a claim of priority is hereby made and the disclosure of which is incorporated by reference.

BACKGROUND OF THE INVENTION

The present invention relates to power semiconductor devices and a method of fabricating a power semiconductor device.

MOSgated devices, such as power MOSFETs and IGBTs are very well known, and have a gate electrode, usually made of conductive polysilicon, which must be electrically insulated from the source electrode (or emitter electrode) and yet must be electrically connected to an external metallic gate conductor or gate pad, usually of aluminum. In a self aligned contact power MOSFET, contact to the source is made in the active area, using spacer technology. However, the gate metal-to-gate polysilicon contact at the gate pad has required the use of a separate photo mask step.

U.S. Pat. No. 6,893,923, assigned to the assignee of the present application, discloses a power MOSFET (FIG. 1) which includes a recess formed in the field oxide in the termination region thereof. The recess is formed during the active mask step in which the field oxide layer is etched to define the active area and the bottom thereof is oxidized during the gate oxidation step. Thus, the oxide in the bottom of the recess is the same thickness as the gate oxide in the device.

The present invention provides certain improvements over the process and the device disclosed in the prior art.

SUMMARY OF THE INVENTION

A power semiconductor device according to an embodiment of the present invention includes an active region having a plurality of gate structure each having a gate insulation of a first thickness, a termination region, the termination including a field insulation body surrounding the active region, the field insulation body having a recess formed therein the recess having a bottom insulation of a second thickness that is thicker than the first thickness, and a conductive body formed in the recess on the bottom insulation, and a PN region disposed under the bottom insulation.

A power MOSFET according to the preferred embodiment further includes a field plate structure adjacent the field insulation body and the active region, the field plate region including a field plate insulation body thicker than the first thickness, and a conductive field plate body disposed over the field plate insulation body.

According to an aspect of the present invention the PN region includes a region of one conductivity formed in a region of another conductivity, the region of one conductivity being disposed directly under the bottom insulation and the bottom insulation including conductive impurities of the one conductivity. Furthermore, the field plate insulation body may include conductive impurities of the one conductivity.

A method for fabricating a power semiconductor device according to the present invention may include depositing a field oxide body on a surface of a semiconductor body of a first conductivity, forming an opening in the field oxide body whereby a portion of the semiconductor body is exposed, implanting dopants of a second conductivity in the semiconductor body through the opening in the field oxide body, growing an oxide body on the semiconductor body having a first thickness, removing a portion of the field oxide body to define an active region, growing a gate oxide body over the defined active region, the gate oxide having a second thickness less than the first thickness, depositing polysilicon over the gate oxide body and inside the opening, and removing portions of the polysilicon to define a plurality of gate electrodes, and a conductive body inside the opening.

Other features and advantages of the present invention will become apparent from the following description of the invention which refers to the accompanying drawings.

DETAILED DESCRIPTION OF EMBODIMENTS OF THE INVENTION

Figure 1:
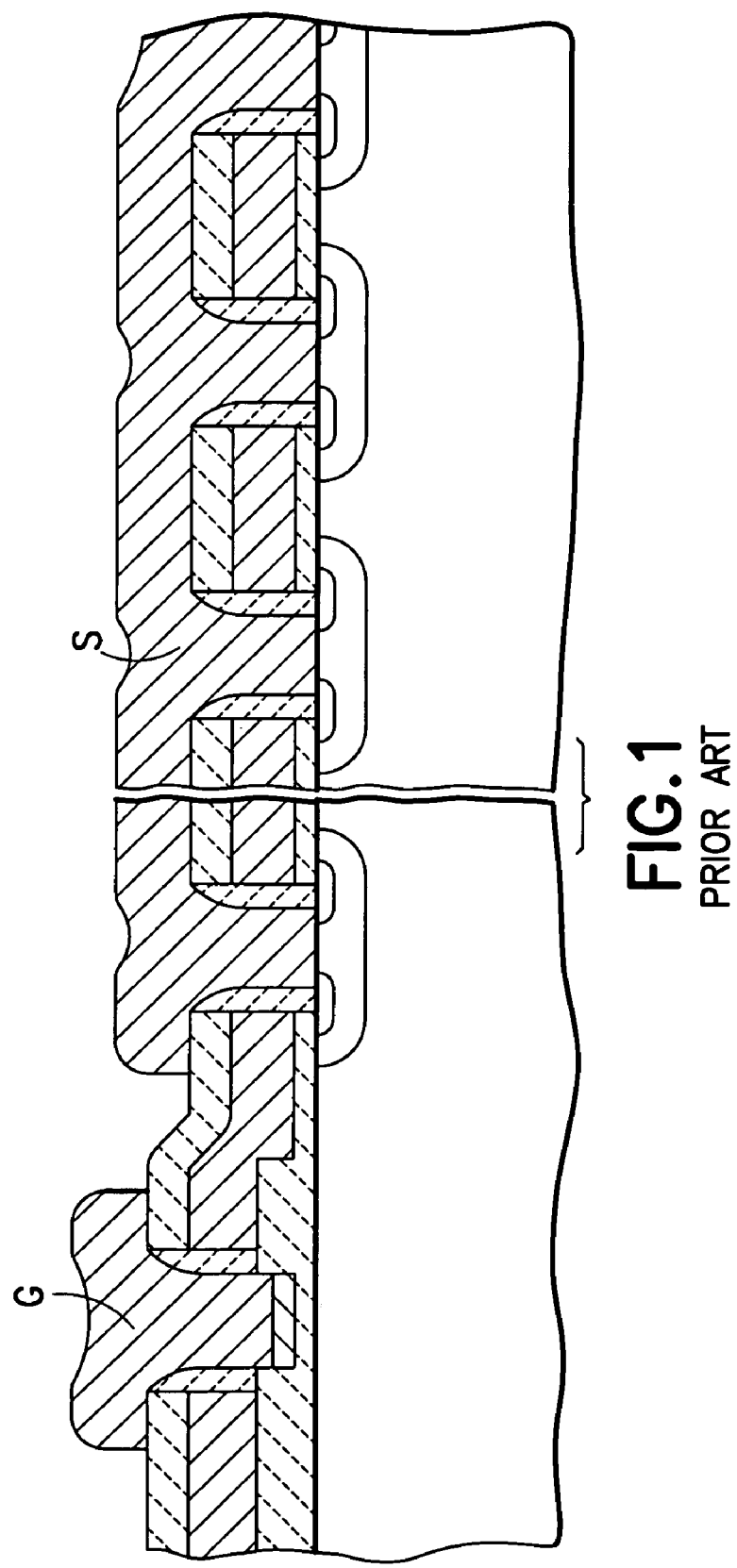
FIG. 1 illustrates a power semiconductor device according to prior art.
Figure 2A:
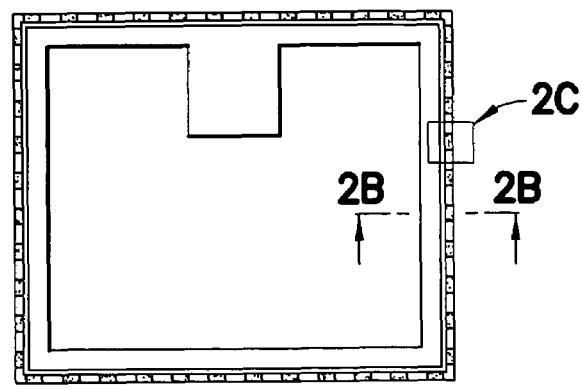
FIG. 2A schematically shows a top plan view of a power semiconductor device according to the present invention.
Figure 2B:
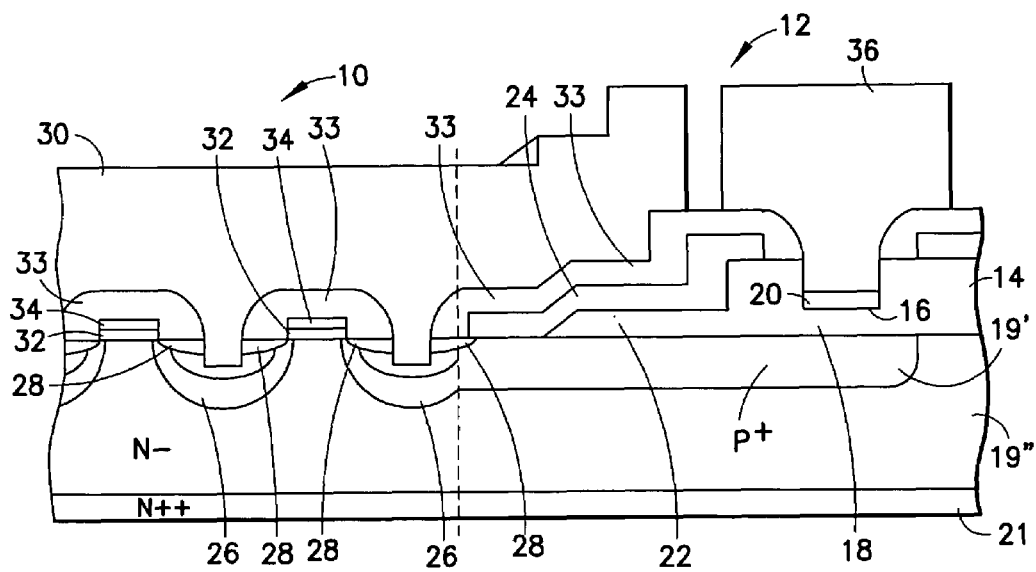
FIG. 2B schematically shows a cross-sectional view of a device according to the present invention along line 2B-2B in FIG. 2A viewed in the direction of the arrows.
Figure 2C:
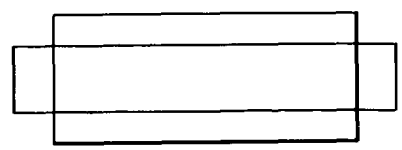
FIG. 2C schematically illustrates an enlarged view of section 2C in FIG. 2A

Referring to FIGS. 2A-2C, a power semiconductor device according to the present invention includes an active region 10 and a termination region 12. Termination region 12 includes a field insulation body 14 surrounding active region 10. Field insulation body 14 includes a recess 16 formed therein having bottom insulation 18, an electrically conductive body 20 formed over bottom insulation 18 and metallic gate runner 36 electrically connected to conductive body 20. Note that a PN junction region 19 is disposed under at least bottom insulation 18. PN junction region in the preferred embodiment includes diffusion region 19' of preferably P type variety formed in a semiconductor body 19" of N type variety.

A device according to the preferred embodiment further includes a field plate structure adjacent field insulation body 14 and active region 10. Field plate structure preferably includes field plate insulation body 22, and conductive field plate body 24 disposed over field plate insulation body 22. Note that in the preferred embodiment PN junction region 19 extends into active region 10 and is integrated with a base region 26 of the same conductivity. Note that in the preferred embodiment base region 26 includes source region 28 formed therein. A source electrode is ohmically connected to at least source regions 28.

Active region 10 further includes a plurality of gate structures, each including a gate insulation body 32, and a gate electrode 34 formed on gate insulation body 32. An insulation cap 33 composed preferably of silicon dioxide electrically insulates each gate electrode 34 and field plate 24.

According to one aspect of the present invention bottom insulation 18, and field plate insulation 22 are thicker than gate insulation bodies 32. Thus, for example, gate insulation bodies 32 are usually less than 1000 Å thick, while bottom insulation 18 and field plate insulation 22 may be up to 3000 Å thick or thicker insulation (but less than the thickness of field insulation body 14). Furthermore, field body 14 may be composed of field oxide (e.g. TEOS), and bottom insulation 18 and field plate insulation 22 may be composed of grown oxide, which is denser than field oxide.

According to another aspect of the present invention field plate insulation 22 and bottom insulation 18 are doped with dopants of the same polarity as region 19'. Thus, in the preferred embodiment, field plate insulation 22 and bottom insulation 18 are P type doped.

Preferably, conductive body 20, conductive field plate body 24, and gate electrodes 34 are composed of conductive polysilicon.

Figure 3A:
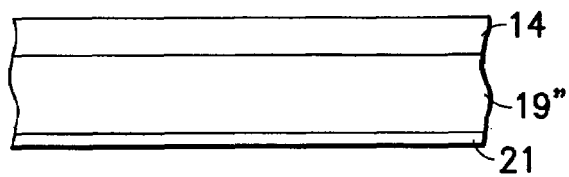
FIGS. 3A-3E illustrate a method for fabricating a power MOSFET according to the present invention.

Referring next to FIGS. 3A-3E, a power semiconductor device according to an embodiment of the present invention is fabricated by first depositing a field insulation (oxide) body 14 over a semiconductor body 19'' of one conductivity (FIG. 3A). Semiconductor body 19'' is preferably an N type epitaxially grown silicon body on a silicon substrate 21.

Figure 3B:
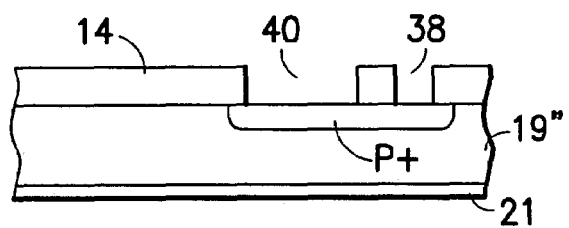

Next, a first opening 38 and a second opening 40 are formed in field oxide 14, each opening exposing a portion of semiconductor body 19'' below field oxide body 14 as illustrated by FIG. 3B.

Thereafter, dopants of a conductivity opposite to that of semiconductor body 19'' (e.g. P type dopants) are implanted into semiconductor body 19'' through openings 38, 40 as illustrated again by FIG. 3B.

Figure 3C:
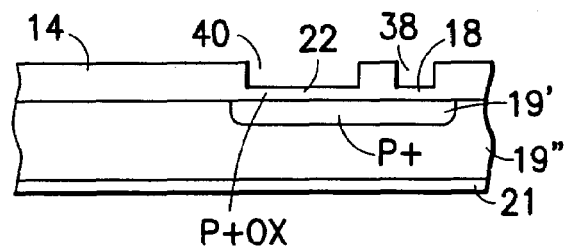

Next, in a thermal step, oxide is grown at the bottom of each opening 38, 40 on the exposed portions of semiconductor body 19''. During the thermal step the implanted P type dopants are driven to form region 19'. Note that the oxide grown at the bottom of opening 38 will serve as bottom insulation 18, and the oxide at the bottom of opening 40 will serve as field plate insulation 22. The structure so obtained is illustrated by FIG. 3C.

Figure 3D:
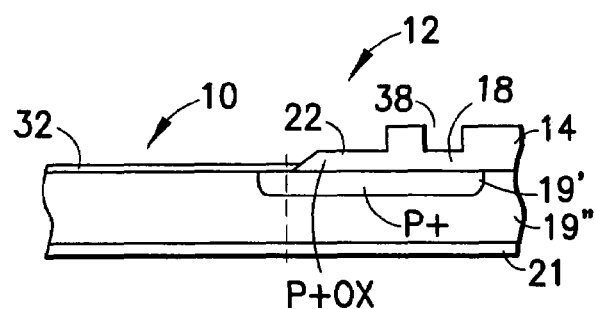
Figure 3E:
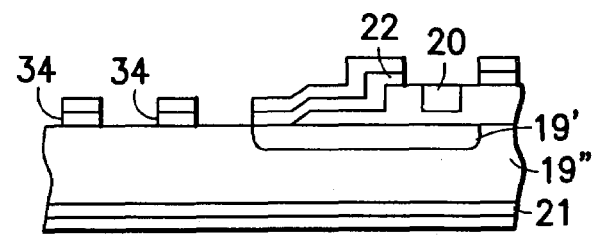

Thereafter, field oxide 14 is removed to define the area for active region 10 as shown by FIG. 3D.

Gate oxide 32 is then grown in a thermal step over the exposed portion of semiconductor body 19''. Next, polysilicon is deposited, which fills opening 38, and covers field plate insulation 22. Polysilicon is then patterned to form gate electrodes 34, field plate conductive body 24, and conductive body 20.

Conventional steps are then carried out to a device according to the present invention as illustrated above.

Figure 4A:
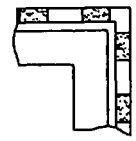
FIGS. 4A-4B illustrate two examples regarding contact to the polysilicon band in the termination region.
Figure 4B:
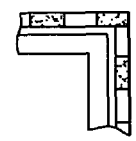

Note that contact may be made outside existing band 20 of polysilicon resulting in a wider region 19' (see FIG. 4A). Alternatively, contact may be made inside of existing band 20 of polysilicon resulting in region 19' of the same dimension, but a wider field resulting in a narrower insulation 22 down to the active region.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
    an active region, said active region including a plurality of gate structures each having a gate insulation of a first thickness;
    a termination region, said termination including a field insulation body surrounding said active region, said field insulation body having a recess formed therein said recess having a bottom insulation of a second thickness that is thicker than said first thickness;
    a conductive body formed in said field insulation body having a recess formed therein having a on said bottom insulation;
    a field plate structure adjacent said field insulation body and disposed between said active region and said recess, said field plate structure including a field plate insulation body thicker than said first thickness, and a conductive field plate body disposed over said field plate insulation body; and
    a PN junction region extends from under said recess having said bottom insulation, below said field plate structure and into said active region.

2. A power semiconductor device according to claim 1, wherein said active region includes at least one source region and a source electrode ohmically connected to said source region.

3. A power semiconductor device according to claim 1, wherein said first thickness is less than 1000 angstroms and said second thickness is less than 3000 angstroms.

4. A power semiconductor device according to claim 1, wherein said first thickness is less than 1000 angstroms and said field plate insulation body is less than 3000 angstroms.

5. A power semiconductor device according to claim 1, wherein said field insulation body is a field oxide having a first density and said bottom insulation is comprised of a grown oxide having a second density, said field oxide being less dense than said grown oxide.

6. A power semiconductor device according to claim 1, wherein said PN junction region includes a region of one conductivity formed in a region of another conductivity, said region of one conductivity being disposed directly under said bottom insulation, wherein said bottom insulation includes conductive impurities of said one conductivity.

7. A power semiconductor device according to claim 1, wherein said PN junction region includes a region of one conductivity formed in a region of another conductivity, said region of one conductivity being disposed directly under said field plate insulation body, wherein said field plate insulation body includes conductive impurities of said one conductivity.

8. A power semiconductor device according to claim 1, further comprising a metallic body in ohmic contact with said conductive body in said recess.

9. A power semiconductor device according to claim 1, wherein said conductive body in said recess and said conductive field plate body are comprised of conductive polysilicon.

* * * * *